(12) United States Patent
Liu et al.

(10) Patent No.: US 8,673,727 B1
(45) Date of Patent: Mar. 18, 2014

(54) FLEXIBLE NON-VOLATILE MEMORY

(71) Applicant: National Chiao Tung University, Hsinchu (TW)

(72) Inventors: Po-Tsun Liu, Hsinchu (TW);
Yang-Shun Fan, Hsinchu County (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/711,626

(22) Filed: Dec. 12, 2012

(30) Foreign Application Priority Data

Sep. 6, 2012 (TW) ................................ 101132514 A

(51) Int. Cl.
*H01L 21/20* (2006.01)

(52) U.S. Cl.
USPC ............ 438/381; 438/382; 438/384; 438/104; 257/E21.476

(58) Field of Classification Search
USPC .......................... 438/381–385, 104, 210, 238; 257/E21.476
See application file for complete search history.

(56) References Cited

U.S. PATENT DOCUMENTS

| | | | |
|---|---|---|---|
| 7,407,858 B2 | 8/2008 | Li et al. | |
| 7,759,771 B2 * | 7/2010 | Lee et al. | 257/537 |
| 8,154,003 B2 * | 4/2012 | Lee et al. | 257/4 |
| 8,530,877 B2 * | 9/2013 | Onishi et al. | 257/4 |
| 2006/0226411 A1 * | 10/2006 | Lee | 257/2 |
| 2010/0021626 A1 | 1/2010 | Hsieh et al. | |
| 2010/0065803 A1 * | 3/2010 | Choi et al. | 257/4 |
| 2013/0240825 A1 * | 9/2013 | Fujii et al. | 257/4 |

OTHER PUBLICATIONS

M. K. Yang, J.-W. Park, T. K Ko, and J.-K. Lee,"Bipolar resistive switching behavior in Ti/MnO2/Pt structure for nonvolatile memory devices," Appl. Phys. Lett. 95, 042105 (2009).
C. H. Kim, Y. H. Jang, H. J. Hwang, C. H. Song, Y. S. Yang et al,"Bistable resistance memory switching effect in amorphous InGaZnO thin films," Appl. Phys. Lett. 97, 062109 (2010).
Z.Q. Wang, H.Y. Xu, X.H. Li, X.T. Zhang, Y.X. Liu, Y.C. Liu,"Flexible Resistive Switching Memory Device Based on Amorphous InGaZnO Film With Excellent Mechanical Endurance," Electron Device Letters, I, (2011).

\* cited by examiner

*Primary Examiner* — Thanh Nguyen
(74) *Attorney, Agent, or Firm* — CKC & Partners Co., Ltd.

(57) ABSTRACT

A manufacturing method for manufacturing a flexible non-volatile memory is provided. The manufacturing method comprises the steps outlined below. A flexible substrate is provided. A planarization layer is formed on the flexible substrate. A metal bottom electrode layer is deposited on the planarization layer. A mask is formed to define a plurality of patterns. An AZTO layer having a plurality of electrically independent AZTO cells is deposited on the metal bottom electrode layer corresponding to the patterns. A top electrode layer is deposited on the AZTO layer corresponding to the AZTO cells to form a plurality of non-volatile memory cells.

10 Claims, 9 Drawing Sheets

FLEXIBLE NON-VOLATILE MEMORY

RELATED APPLICATIONS

This application claims priority to Taiwan Application Serial Number 101132514 filed Sep. 6, 2012, which is herein incorporated by reference.

BACKGROUND

1. Technical Field

The present disclosure relates to a memory and its manufacturing method. More particularly, the present disclosure relates to a flexible non-volatile memory and a manufacturing method of the same.

2. Description of Related Art

Memory devices can be distinguished into volatile memory devices and non-volatile memory devices, in which the volatile memory devices can be further categorized into DRAM (dynamic random access memory) and SRAM (static random access memory). These memory devices are widely used due to their high access speed. On of the most popular non-volatile memory device is flash memory. However, the shortcomings of the flash memory devices such as high operating voltage, slow rewriting speed, and limited number of rewrites make them unreliable. Further, due to the smaller size of the devices, the gate oxide layer of the flash memory devices becomes thinner and causes larger leakage current. Recently, the resistive non-volatile memory devices gains attention because of their advantages of simple structure, low operating voltage, fast rewriting speed, high applicability to multi-bit applications, good endurance of read/write, small size, non-destructive read operation and low cost.

In recent years, the development of the resistive non-volatile memory devices is considered as the best candidate for high-density device in the next generation. The common structure used by the resistive non-volatile memory devices is MIM (metal layer/intrinsic layer/metal layer). An external bias voltage is used to modify the resistance of the devices to perform the read and the write operations such that the devices can switch between a high resistance state and a low resistance state corresponding to the states of "0" and "1" of the digital signal. The resistive switching layer formed by the metal oxide is the most important and the most studied part of the resistive non-volatile memory devices. However, flexible electronic devices gain more and more popularity. The material and the design of the resistive non-volatile memory devices have to be well selected and well-designed in order to make the resistive switching layer have a good endurance under the circumstances of frequent switches between different resistance states and frequent bending of the devices.

Accordingly, what is needed is a flexible non-volatile memory and a manufacturing method of the same to accomplish the

SUMMARY

An aspect of the present invention is to provide a manufacturing method for manufacturing a flexible non-volatile memory. The manufacturing method comprises the steps outlined below. A flexible substrate is provided. A planarization layer is formed on the flexible substrate. A metal bottom electrode layer is deposited on the planarization layer. A mask is formed to define a plurality of patterns. An AZTO (aluminum zinc tin oxide) resistive switching layer having a plurality of electrically independent AZTO resistive switching cells corresponding to the patterns is deposited on the metal bottom electrode layer. The mask is removed and a top electrode layer is deposited on the AZTO resistive switching layer corresponding to the AZTO resistive switching cells to form a plurality of non-volatile memory cells.

Another aspect of the present invention is to provide a manufacturing method for manufacturing a flexible non-volatile memory. The manufacturing method comprises the steps outlined below. A flexible substrate is provided. A planarization layer is formed on the flexible substrate. A metal bottom electrode layer is deposited on the planarization layer. An AZTO resistive switching layer is deposited on the metal bottom electrode layer. A mask is formed to define a plurality of patterns. A top electrode layer having a plurality of electrically independent top electrode cells corresponding to the patterns is deposited on the AZTO resistive switching layer and removing the mask to form a plurality of non-volatile memory cells.

Yet another aspect of the present invention is to provide a flexible non-volatile memory. The flexible non-volatile memory comprises a flexible substrate; a planarization layer, a metal bottom electrode layer, an AZTO resistive switching layer and a top electrode layer. The planarization layer is formed on the flexible substrate. The metal bottom electrode layer is deposited on the planarization layer. The AZTO resistive switching layer having a plurality of electrically independent AZTO resistive switching cells is formed on the metal bottom electrode layer. The top electrode layer is formed on the AZTO resistive switching layer corresponding to the AZTO resistive switching cells to form a plurality of non-volatile memory cells.

Further another aspect of the present invention is to provide a flexible non-volatile memory. The flexible non-volatile memory comprises a flexible substrate; a planarization layer, a metal bottom electrode layer, an AZTO resistive switching layer and a top electrode layer. The planarization layer is formed on the flexible substrate. The metal bottom electrode layer is deposited on the planarization layer. The AZTO resistive switching layer is formed on the metal bottom electrode layer. The top electrode layer having a plurality of electrically independent top electrode cells is formed on the AZTO resistive switching layer to form a plurality of non-volatile memory cells.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
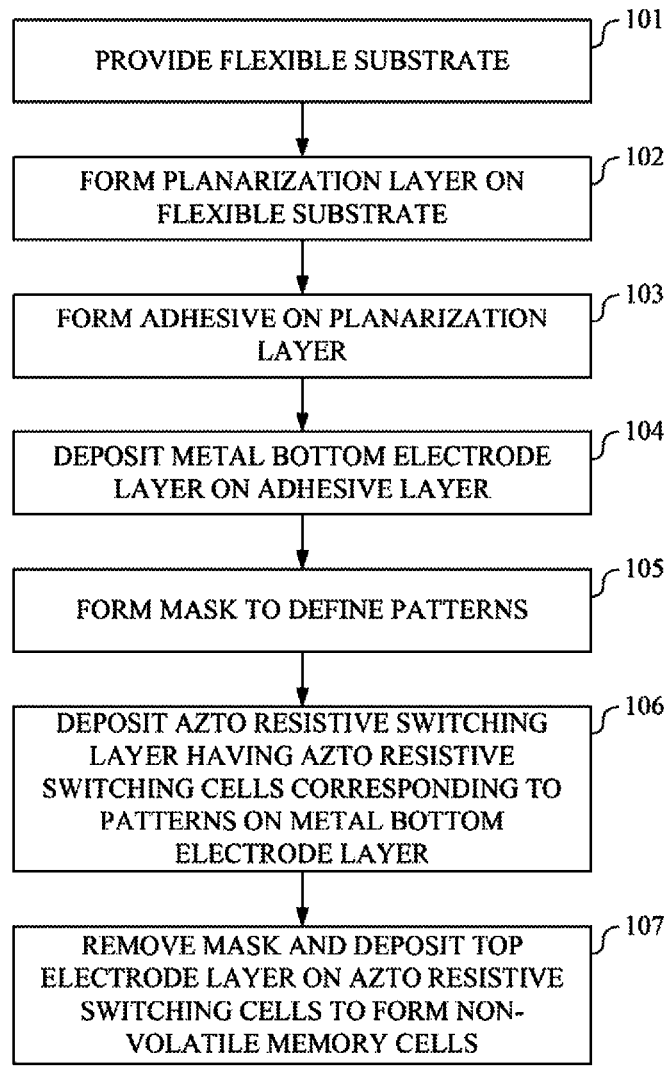
FIG. 1 is a flow chart of a manufacturing method for manufacturing a flexible non-volatile memory in an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a flow chart of a manufacturing method 100 for manufacturing a flexible non-volatile memory in an embodiment of the present disclosure. FIG. 2A to FIG. 2G are cross-sectional views of the flexible non-volatile memory corresponding to the steps of the manufacturing method 100 in an embodiment of the present disclosure.

Figure 2A:
FIG. 2A to FIG. 2G are cross-sectional views of the flexible non-volatile memory corresponding to the steps of the manufacturing method in an embodiment of the present disclosure.

Please refer to FIG. 1 and FIG. 2A at the same time. In step 101, a flexible substrate 201 is provided. In an embodiment, the material of the flexible substrate 201 is stainless steel or plastic. The flexible substrate 201 can be bent to different radius of curvature when different magnitudes of force are applied. Further, the flexible substrate 201 can be bounced back to the original state when there is no force applied and is suitable in the manufacturing of the flexible electronic devices.

Figure 2B:

Please refer to FIG. 1 and FIG. 2B at the same time. In step 102, a planarization layer 202 is formed on the flexible substrate 201. In an embodiment, the material of the planarization layer is $SiO_2$ to guarantee the flatness of the surface of the flexible substrate 201.

Figure 2C:
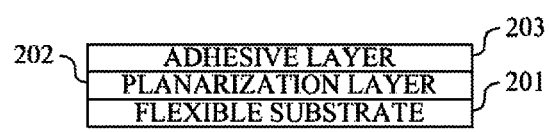

Please refer to FIG. 1 and FIG. 2C at the same time. In step 103, an adhesive layer 203 is formed on the planarization layer 202. In an embodiment, the material of the adhesive layer 203 is metal oxide such as $TiO_2$. In some embodiments, the adhesive layer 203 can be directly formed by metal, e.g. Ti. The adhesive layer 203 provides better adhesion to the metal layer formed subsequently. In an embodiment, the memory device can be manufactured without forming the adhesive layer 203 such that the metal layer is formed directly on the planarization layer 202. However, the adhesion of the metal layer to the planarization layer 202 is worse due to the absence of the adhesive layer 203.

Figure 2D:
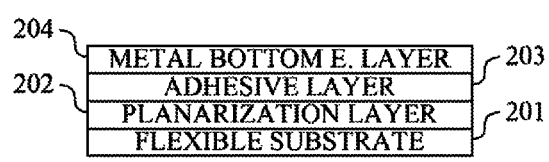

Please refer to FIG. 1 and FIG. 2D at the same time. In step 104, a metal bottom electrode layer 204 (shown as METAL BOTTOM E. LAYER in FIG. 2D and subsequent figures) is deposited on the planarization layer 203. In an embodiment, the material of the metal bottom electrode layer 204 is Au or Pt. The metal bottom electrode layer 204 can be deposited on the planarization layer 203 by physical vapor deposition processes such as the electron beam evaporation process or other possible manufacturing processes.

Figure 2E:
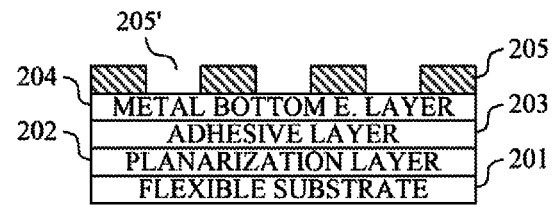

Please refer to FIG. 1 and FIG. 2E at the same time. In step 105, a mask 205 formed to define a plurality of patterns 205'.

Figure 2F:
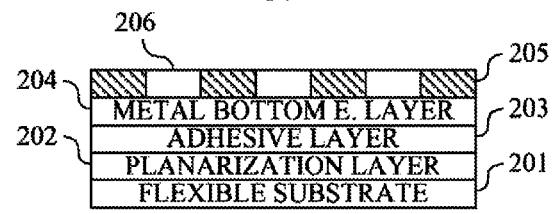

Please refer to FIG. 1 and FIG. 2F at the same time. In step 106, an AZTO (aluminum zinc tin oxide) resistive switching layer having a plurality of electrically independent AZTO resistive switching cells 206 corresponding to the patterns 205' is deposited on the metal bottom electrode layer 204. AZTO is a transparent amorphous oxide semiconductor device that can be deposited at low temperature (under 100 degrees Celsius). Further, AZTO has the characteristic of excellent uniformity. The AZTO resistive switching layer can be deposited on the metal bottom electrode layer 204 by physical vapor deposition processes such as the plasma sputtering process or other possible manufacturing processes.

Figure 2G:
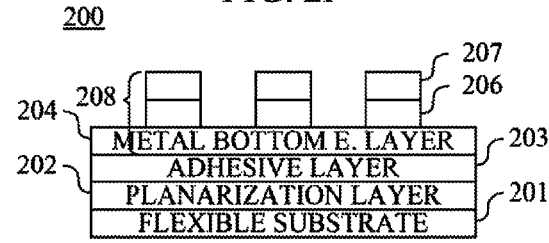
Figure 2H:
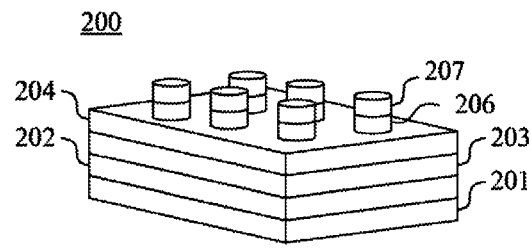
FIG. 2H is a 3-D (three dimensional) view of the flexible non-volatile memory in an embodiment of the present disclosure.

Please refer to FIG. 1 and FIG. 2G at the same time. In step 107, the mask 205 is removed and a top electrode layer 207 is deposited on the AZTO resistive switching layer corresponding to the AZTO resistive switching cells 206 to form a plurality of non-volatile memory cells 208 to finish the manufacturing process of the flexible non-volatile memory 200. The final structure is as shown in FIG. 2H, in which FIG. 2H is a 3-D (three dimensional) view of the flexible non-volatile memory 200. In an embodiment, the material of the top electrode layer 207 is Ti, TiN or ITO. The top electrode layer 207 can be deposited on the AZTO resistive switching layer by physical vapor deposition processes such as the plasma sputtering process or other possible manufacturing processes.

Figure 3:
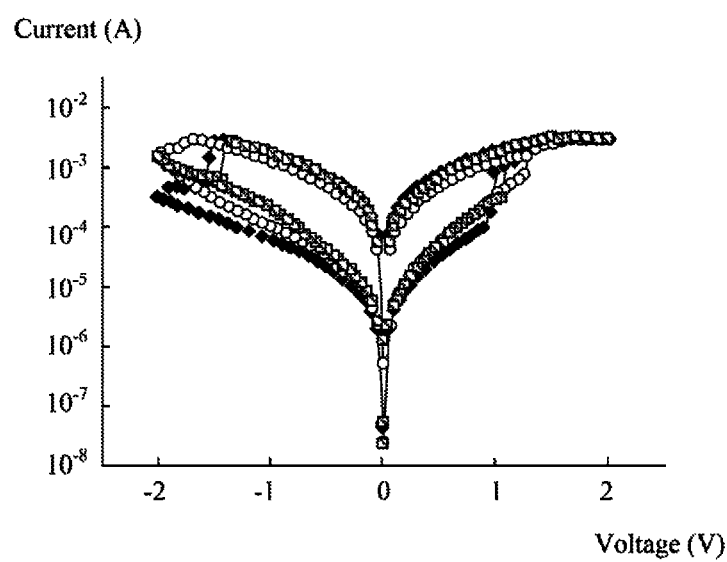
FIG. 3 is a diagram depicting the relation between the voltage and the current when a bias voltage within 2V is applied to the metal bottom electrode layer and the top electrode layer of the flexible non-volatile memory.

FIG. 3 is a diagram depicting the relation between the voltage and the current when a bias voltage within 2V is applied to the metal bottom electrode layer 204 and the top electrode layer 207 of the flexible non-volatile memory 200. It is noted that the curve formed by the diamond-shaped points is generated according to the first time set and reset procedure. The curve formed by the round-shaped points is generated according to the condition of the 100th time of the set and reset procedure. The curve formed by the square-shaped points is generated according to the condition of the 200th set and reset procedure.

As shown in FIG. 3, after a positive bias voltage is applied to the metal bottom electrode layer 204 and the top electrode layer 207, the current that flows through the AZTO resistive switching cells 206 increases rapidly when Vset is applied since the device switches to the low resistance state. After a negative bias voltage is applied to the metal bottom electrode layer 204 and the top electrode layer 207, the current that flows through the AZTO resistive switching cells 206 decreases rapidly when Vreset is applied since the device switches to the high resistance state. Hence, the AZTO resistive switching cells 206 can switch between the states of "1" and "0". Since the states is defined according to the resistance of the AZTO resistive switching cells 206, they are called resistive memory devices.

Consequently, the steps described above can be used to form the flexible non-volatile memory. The AZTO can be used as the replacement of In and Ga since they are in great demand for use in the manufacturing process of the memory devices. Further, AZTO has great characteristics of the memory and can be fabricated in low temperature circumstance (under 100 degrees Celsius).

Figure 4:
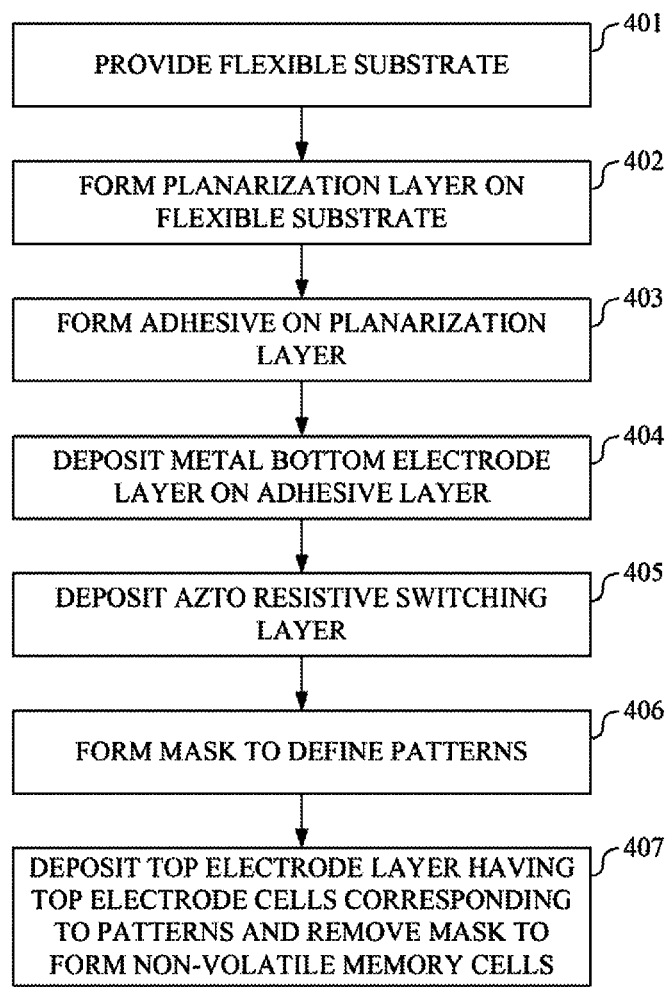
FIG. 4 is a flow chart of a manufacturing method for manufacturing a flexible non-volatile memory in an embodiment of the present disclosure.

FIG. 4 is a flow chart of a manufacturing method 400 for manufacturing a flexible non-volatile memory in an embodiment of the present disclosure. FIG. 5A to FIG. 5G are cross-sectional views of the flexible non-volatile memory corresponding to the steps of the manufacturing method 400 in an embodiment of the present disclosure.

Figure 5A:
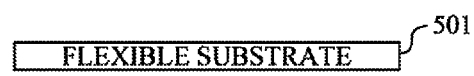
FIG. 5A to FIG. 5G are cross-sectional views of the flexible non-volatile memory corresponding to the steps of the manufacturing method in an to embodiment of the present disclosure.

Please refer to FIG. 4 and FIG. 5A at the same time. In step 401, a flexible substrate 501 is provided. In an embodiment, the material of the flexible substrate 501 is stainless steel or plastic. The flexible substrate 501 can be bent to different radius of curvature when different magnitudes of force are applied. Further, the flexible substrate 501 can be bounced back to the original state when there is no force applied and is suitable in the manufacturing of the flexible electronic devices.

Figure 5B:

Please refer to FIG. 4 and FIG. 5B at the same time. In step 402, a planarization layer 502 is formed on the flexible substrate 501. In an embodiment, the material of the planarization layer is $SiO_2$ to guarantee the flatness of the surface of the flexible substrate 501.

Figure 5C:
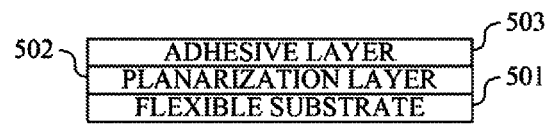

Please refer to FIG. 4 and FIG. 5C at the same time. In step 403, an adhesive layer 503 is formed on the planarization layer 502. In an embodiment, the material of the adhesive layer 503 is metal oxide such as $TiO_2$. In some embodiments, the adhesive layer 503 can be directly formed by metal, e.g. Ti. The adhesive layer 503 provides better adhesion to the metal layer formed subsequently. In an embodiment, the memory device can be manufactured without forming the adhesive layer 503 such that the metal layer is formed directly on the planarization layer 502. However, the adhesion of the metal layer to the planarization layer 502 is worse due to the absence of the adhesive layer 503.

Figure 5D:
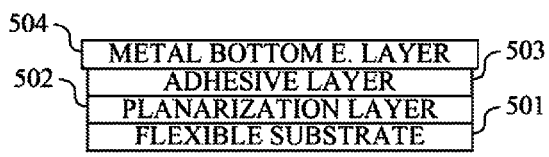

Please refer to FIG. 4 and FIG. 5D at the same time. In step 404, a metal bottom electrode layer 504 (shown as METAL BOTTOM E. LAYER in FIG. 2D and subsequent figures) is deposited on the planarization layer 503. In an embodiment, the material of the metal bottom electrode layer 504 is Au or Pt. The metal bottom electrode layer 504 can be deposited on the planarization layer 503 by physical vapor deposition processes such as the electron beam evaporation process or other possible manufacturing processes.

Figure 5E:
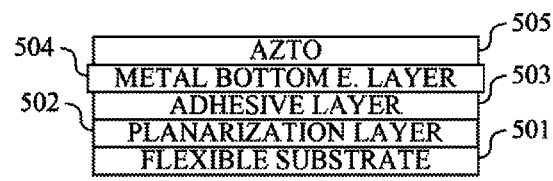

Please refer to FIG. 4 and FIG. 5E at the same time. In step 405, an AZTO (aluminum zinc tin oxide) resistive switching layer 505 is deposited on the metal bottom electrode layer 404. AZTO is a transparent amorphous oxide semiconductor device that can be deposited at low temperature (under 100 degrees Celsius). Further, AZTO has the characteristic of excellent uniformity. The AZTO resistive switching layer 505 can be deposited on the metal bottom electrode layer 504 by physical vapor deposition processes such as the plasma sputtering process or other possible manufacturing processes.

Figure 5F:
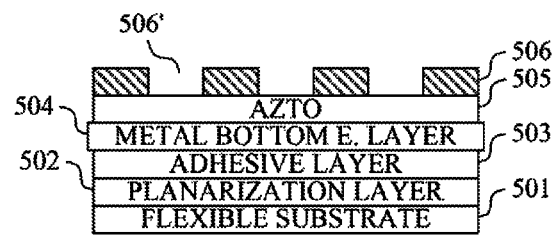

Please refer to FIG. 4 and FIG. 5F at the same time. In step 406, a mask 506 is formed to define a plurality of patterns 506'.

Figure 5G:
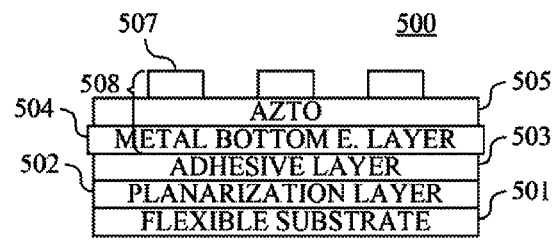
Figure 5H:
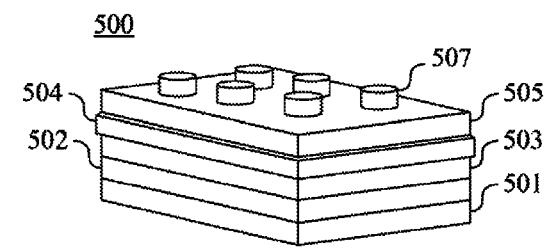
FIG. 5H is a 3-D view of the flexible non-volatile memory in an embodiment of the present disclosure.

Please refer to FIG. 4 and FIG. 5G at the same time. In step 507, a top electrode layer having a plurality of electrically independent top electrode cells 507 corresponding to the patterns 506' on the AZTO resistive switching layer 505 and the mask 506 is removed to form a plurality of non-volatile memory cells to finish the manufacturing process of the flexible non-volatile memory 500. The final structure is as shown in FIG. 5H, in which. FIG. 5H is a 3-D (three dimensional) view of the flexible non-volatile memory 500. In an embodiment, the material of the top electrode layer is Ti, TiN or ITO. The top electrode layer can be deposited on the AZTO resistive switching layer 505 by physical vapor deposition processes such as the plasma sputtering process or other possible manufacturing processes.

Hence, a flexible non-volatile memory having the similar voltage and current characteristics as shown in FIG. 3 can be manufactured by the manufacturing method 400. It is noted that in some embodiments, the width of the bottom electrode layer 504 can be slightly larger than the width of the adhesive layer 503 and the AZTO resistive switching layer 505 as shown in FIG. 5G in order to measure the voltage of the device or apply the voltage on the device.

Figure 6:
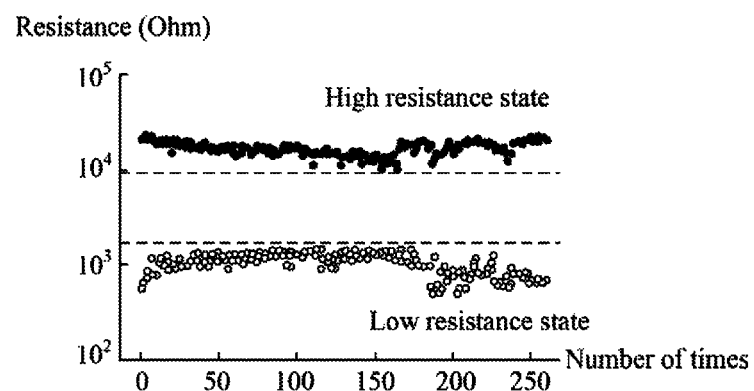
FIG. 6 is a diagram depicting the relation between the number of times of continuous switching of the resistance states and the resistance of the flexible non-volatile memory in an embodiment of the present invention.

FIG. 6 is a diagram depicting the relation between the number of times of continuous switching of the resistance states and the resistance of the flexible non-volatile memory 200 or 500 in an embodiment of the present invention. The continuous switching of the resistance states is applied to the flexible non-volatile memory 200 or 500 for endurance test. As shown in FIG. 6, the ratio of the average resistance between the high resistance state and the low resistance is over 18 even after at least 256 times of switching. Accordingly, the flexible non-volatile memory 200 or 500 can maintain the characteristic of memory and the performance is not degraded due to the continuous switching.

Figure 7:
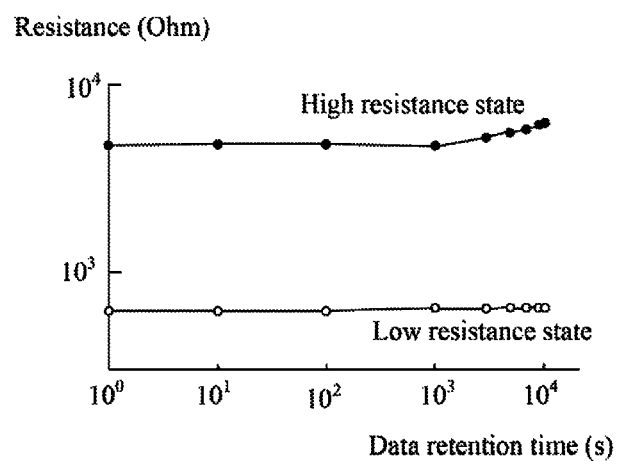
FIG. 7 is a diagram depicting the relation between the data retention time and the resistance of the flexible non-volatile memory in an embodiment of the present invention.

FIG. 7 is a diagram depicting the relation between the data retention time and the resistance of the flexible non-volatile memory 200 or 500 in an embodiment of the present invention. As shown in FIG. 7, an external read voltage of 200 mV is applied continuously to the flexible non-volatile memory 200 or 500 in the high resistance state and in the low resistance state respectively. The device is in a circumstance of 300K temperature for measuring its resistance. It is obvious that the data retention characteristic can be maintained in at least $10^4$ seconds.

Figure 8:
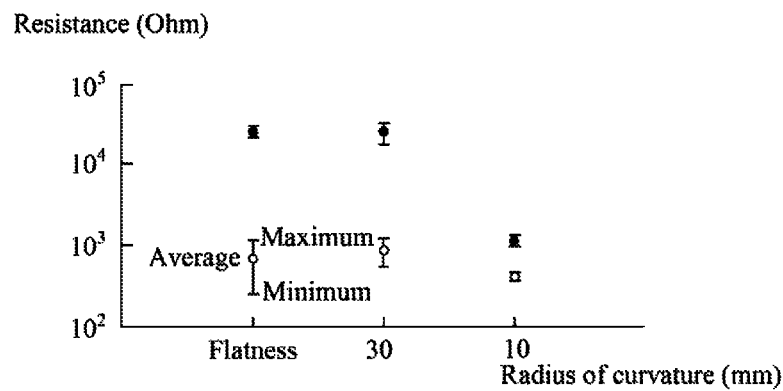
FIG. 8 is a diagram depicting the relation between the radius of curvature and the resistance of the flexible non-volatile memory in an embodiment of the present invention.

FIG. 8 is a diagram depicting the relation between the radius of curvature and the resistance of the flexible non-volatile memory 200 or 500 in an embodiment of the present invention. As shown in FIG. 8, under the conditions of different radius of curvature including 0 mm (i.e. non-bent), 30 mm and 10 mm (the smaller the radius of curvature is, the more the device is bent), the resistance of the device is measured after 100 times of continuous switching between the high resistance state and the low resistance state. The measured resistance is represented by a maximum, an average and a minimum. It is obvious that the flexible non-volatile memory 200 or 500 can maintain the characteristic of memory and therefore can be used in flexible electronics.

Figure 9:
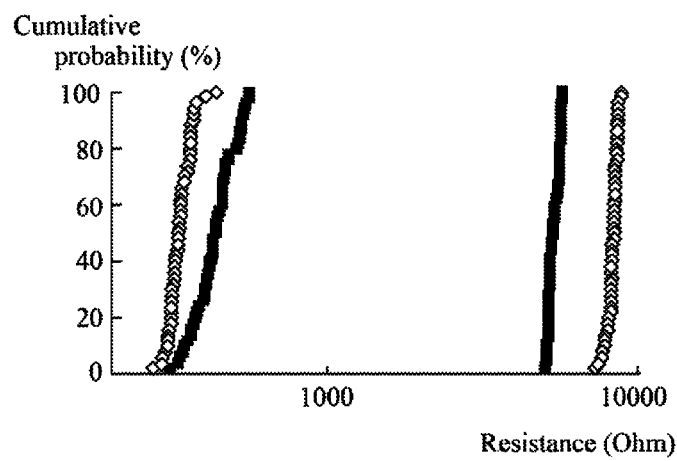
FIG. 9 is a diagram depicting the relation between the resistance and the cumulative probability of the flexible non-volatile memory in an embodiment of the present invention.

FIG. 9 is a diagram depicting the relation between the resistance and the cumulative probability of the flexible non-volatile memory 200 or 500 in an embodiment of the present invention. In FIG. 9, the curve formed by the diamond-shaped points is generated according to the flexible non-volatile memory 200 or 500 that no bending endurance test is applied. The curve formed by the square-shaped points is generated according to the flexible non-volatile memory 200 or 500 after 5000 times of repetitive bending and straightening. It is obvious that the flexible non-volatile memory 200 or 500 can maintain the characteristic of memory even after 5000 times of repetitive bending and straightening.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A manufacturing method for manufacturing a flexible non-volatile memory comprising:
providing a flexible substrate;
forming a planarization layer on the flexible substrate;
depositing a metal bottom electrode layer on the planarization layer;

forming a mask to define a plurality of patterns;

depositing an AZTO (aluminum zinc tin oxide) resistive switching layer having a plurality of electrically independent AZTO resistive switching cells corresponding to the patterns on the metal bottom electrode layer; and removing the mask and depositing a top electrode layer on the AZTO resistive switching layer corresponding to the AZTO resistive switching cells to form a plurality of non-volatile memory cells.

2. The manufacturing method of claim 1, wherein a material of the flexible substrate is stainless steel or plastic.

3. The manufacturing method of claim wherein a material of the planarization layer is $SiO_2$.

4. The manufacturing method of claim further comprising forming an adhesive layer on the planarization layer and the metal bottom electrode layer is actually formed on the adhesive layer.

5. The manufacturing method of claim 4, wherein a material of the adhesive layer is $TiO_2$.

6. The manufacturing method of claim 1, wherein a material of the metal bottom electrode layer is Au or Pt and a material of the top electrode layer is Ti, TiN or ITO.

7. The manufacturing method of claim 1, wherein the manufacturing method is performed under 100 degrees Celsius.

8. A manufacturing method for manufacturing a flexible non-volatile memory comprising:

providing a flexible substrate;

forming a planarization layer on the flexible substrate;

depositing a metal bottom electrode layer on the planarization layer;

depositing an AZTO resistive switching layer on the metal bottom electrode layer;

forming a mask to define a plurality of patterns; and depositing a top electrode layer having a plurality of electrically independent top electrode cells corresponding to the patterns on the AZTO resistive switching layer and removing the mask to form a plurality of non-volatile memory cells.

9. The manufacturing method of claim 8, wherein the manufacturing method is performed under 100 degrees Celsius.

10. The manufacturing method of claim 8, further comprising forming an adhesive layer on the planarization layer and the metal bottom electrode layer is actually formed on the adhesive layer.

* * * * *